US008102649B2

(12) United States Patent
Ma et al.

(10) Patent No.: US 8,102,649 B2
(45) Date of Patent: Jan. 24, 2012

(54) ELECTRONIC DEVICE

(75) Inventors: Mou-Ming Ma, Taipei Hsien (TW); Yi-Yuan Liu, Taipei Hsien (TW); Hsiang-Yun Kuo, Taipei Hsien (TW)

(73) Assignee: Giga-Byte Technology Co., Ltd., Taipei (TW)

( * ) Notice: Subject to any disclaimer, the term of this patent is extended or adjusted under 35 U.S.C. 154(b) by 26 days.

(21) Appl. No.: 12/618,784

(22) Filed: Nov. 16, 2009

(65) Prior Publication Data

US 2011/0075364 A1 Mar. 31, 2011

(30) Foreign Application Priority Data

Sep. 28, 2009 (TW) .............................. 98132755 A

(51) Int. Cl.
*G06F 1/20* (2006.01)
*H05K 7/20* (2006.01)

(52) U.S. Cl. ......... 361/679.47; 361/679.48; 361/679.52; 361/679.54; 361/679.55; 361/695; 361/697; 361/700; 361/703; 361/704; 361/709; 165/80.3; 165/185

(58) Field of Classification Search ............. 361/679.52, 361/679.54–679.55, 694–695, 697, 700, 361/703–704, 709, 679.47–679.48; 165/80.2–80.3, 165/185; 174/15.2, 16.1, 16.3
See application file for complete search history.

(56) References Cited

U.S. PATENT DOCUMENTS

| 6,842,335 | B1 * | 1/2005 | Hanson et al. | 361/679.3 |
|---|---|---|---|---|
| 7,154,746 | B1 * | 12/2006 | Hanson et al. | 361/679.25 |
| 7,156,693 | B2 * | 1/2007 | Kusaka | 439/488 |
| 7,336,489 | B1 * | 2/2008 | Chen et al. | 361/700 |
| 7,345,874 | B2 * | 3/2008 | Cheng et al. | 361/695 |
| 7,362,568 | B2 * | 4/2008 | Huang | 361/679.48 |
| 7,551,429 | B1 * | 6/2009 | Hanson et al. | 361/679.56 |
| 7,643,295 | B2 * | 1/2010 | Chao et al. | 361/700 |
| 7,660,119 | B2 * | 2/2010 | Iikubo | 361/697 |
| 7,830,663 | B2 * | 11/2010 | Iikubo | 361/697 |
| 7,911,781 | B2 * | 3/2011 | Chao et al. | 361/679.48 |
| 7,995,343 | B2 * | 8/2011 | Suzuki et al. | 361/699 |
| 2005/0068723 | A1 * | 3/2005 | Squillante | 361/687 |
| 2007/0131383 | A1 * | 6/2007 | Hattori et al. | 165/11.2 |
| 2008/0253088 | A1 * | 10/2008 | Tracy et al. | 361/695 |
| 2008/0266796 | A1 * | 10/2008 | Iikubo | 361/697 |
| 2009/0009967 | A1 * | 1/2009 | Nishizawa et al. | 361/695 |
| 2009/0223649 | A1 * | 9/2009 | Lee | 165/95 |
| 2009/0223652 | A1 * | 9/2009 | Lee | 165/104.31 |
| 2010/0067195 | A1 * | 3/2010 | Tanaka | 361/692 |
| 2010/0073867 | A1 * | 3/2010 | Tachikawa | 361/679.48 |
| 2010/0073874 | A1 * | 3/2010 | Tachikawa | 361/695 |
| 2010/0073875 | A1 * | 3/2010 | Suzuki et al. | 361/695 |
| 2010/0079947 | A1 * | 4/2010 | Aoki | 361/695 |
| 2010/0238619 | A1 * | 9/2010 | Shirasaka | 361/679.08 |

* cited by examiner

*Primary Examiner* — Robert J Hoffberg
(74) *Attorney, Agent, or Firm* — Chun-Ming Shih

(57) ABSTRACT

An electronic device including a case, a fan module and a transparent cover is provided. The fan module including a fan and a fin set is disposed in the case. The fin set is disposed aside the fan, and a space is formed there between. The transparent cover is connected to the case, and is located above the space formed between the fin set and the fan.

5 Claims, 5 Drawing Sheets ature of the electronic component can be continuously increased. When the temperature of the electronic component reaches a threshold value, an operation stability of the electronic component is influenced, or even the electronic component is damaged.

ELECTRONIC DEVICE

CROSS-REFERENCE TO RELATED APPLICATION

This application claims the priority benefit of Taiwan application serial no. 98132755, filed on Sep. 28, 2009. The entirety of the above-mentioned patent application is hereby incorporated by reference herein and made a part of specification.

BACKGROUND OF THE INVENTION

1. Field of the Invention

The present invention relates to an electronic device. More particularly, the present invention relates to an electronic device which is convenient for using.

2. Description of Related Art

Along with booming development for fabrication techniques of integrated circuits (ICs), electronic components are ameliorated to have faster operation speeds. However, the electronic component operated in a high speed can continuously generate a great amount of heat, and if the heat generated by the electronic component is not expelled, a temperature of the electronic component can be continuously increased. When the temperature of the electronic component reaches a threshold value, an operation stability of the electronic component is influenced, or even the electronic component is damaged.

An information processor (an electronic device such as a computer host, a mobile phone or a notebook computer, etc.) is composed of a plurality of electronic components. Since the electronic device is frequently used, the internal components thereof generally have unsatisfactory operation effects due to too long usage time thereof. FIG. 1 is a schematic diagram illustrating a conventional electronic device. Taking a fan as an example, to maintain an operation function of the electronic device 100 stable, a fan module 110 is generally assembled in the electronic device 100. The fan module 110 includes a fan 112 and a cooling fin 114, wherein the fan 112 provides a cycle air flow to the cooling fin 114, so as to expel the heat generated by the electronic component (for example, a central processor unit), and to maintain a performance and stability of the whole electronic device 100.

Dust can be attached to the cooling fin 114 due to a long usage time of the fan 112 of the electronic device 100. Therefore, a cooling effect of the cooling fin 114 becomes worse, so that the heat generated by the electronic component (for example, the central processor unit) cannot be expelled, and accordingly the operation performance of the electronic component is poor, which can even lead to an operation failure of the electronic device 100.

To remove the dust on the cooling fin 114, a user can send the electronic device 100 to a repair station though, it will take a relatively long time to get the electronic device 100 repaired, and the user has to wait a long time lacking of the electronic device 100. On the other hand, when a maintenance personnel deal with the dust on the cooling fin 114, the maintenance personnel has to disassemble a case and other electronic components of the electronic device 100, and disassemble the cooling fin 114 locked on the case of the electronic device 100. Thereafter, the maintenance personnel uses a brush to directly clean up the dust piled on the cooling fin 114, and then relocks the cleaned cooling fin 114 on the case of the electronic device 100.

In such disassembling method, the maintenance personnel may spend more time to disassemble the components in the electronic device 100. If the electronic device 100 is used in a dusty environment, the dust can be much quickly and easily attached on the cooling fin 114, so that the dust piled on the cooling fin 114 has to be frequently removed, so as to guarantee a normal operation of the electronic device 100.

Therefore, how to facilitate the user easily cleaning the dust piled on the cooling fin 114 is a problem to be resolved urgently.

SUMMARY OF THE INVENTION

The present invention is directed to an electronic device, which is convenient for using.

The present invention provides an electronic device including a case, a fan module and a transparent movable cover. The fan module including a fan and a fin set is disposed in the case. The fin set is disposed aside the fan, and a space is formed between the fin set and the fan. The transparent movable cover is connected to the case and is located above the space formed between the fin set and the fan.

In an embodiment of the present invention, the case has a plurality of openings, and the openings are correspondingly located above the fan of the fan module.

In an embodiment of the present invention, the transparent movable cover is capable of being disassembled from the case.

In an embodiment of the present invention, one side of the transparent movable cover is connected to the case, so that another side of the transparent movable cover is capable of being opened and closed relative to the case. The transparent movable cover includes a body and a pivot. The pivot is disposed at one side of the body, and two ends of the pivot are pivoted to the case, so that another side of the body is capable of being opened and closed relative to the case. The pivot and the body are formed integrally. Moreover, the case has a concave part, and the concave part is located adjacent to the side of the transparent movable cover that is not connected to the case.

In an embodiment of the present invention, the fan module further includes a heat pipe passing through the fin set, and a part of the heat pipe surrounds the fan. Moreover, the fan module further includes a plurality of cooling plates, and the heat pipe is contacted to the cooling plates.

According to the above descriptions, in the electronic device of the present invention, a space is formed between the fan and the fin set, so that a user can observe a status of the dust piled on the fin set through the transparent movable cover capable of being opened relative to the case, and then open the transparent movable cover to clean the fin set. Therefore, the dust piled on the fin set can be cleaned without disassembling the fin set from the electronic device, so that the electronic device is convenient for using.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
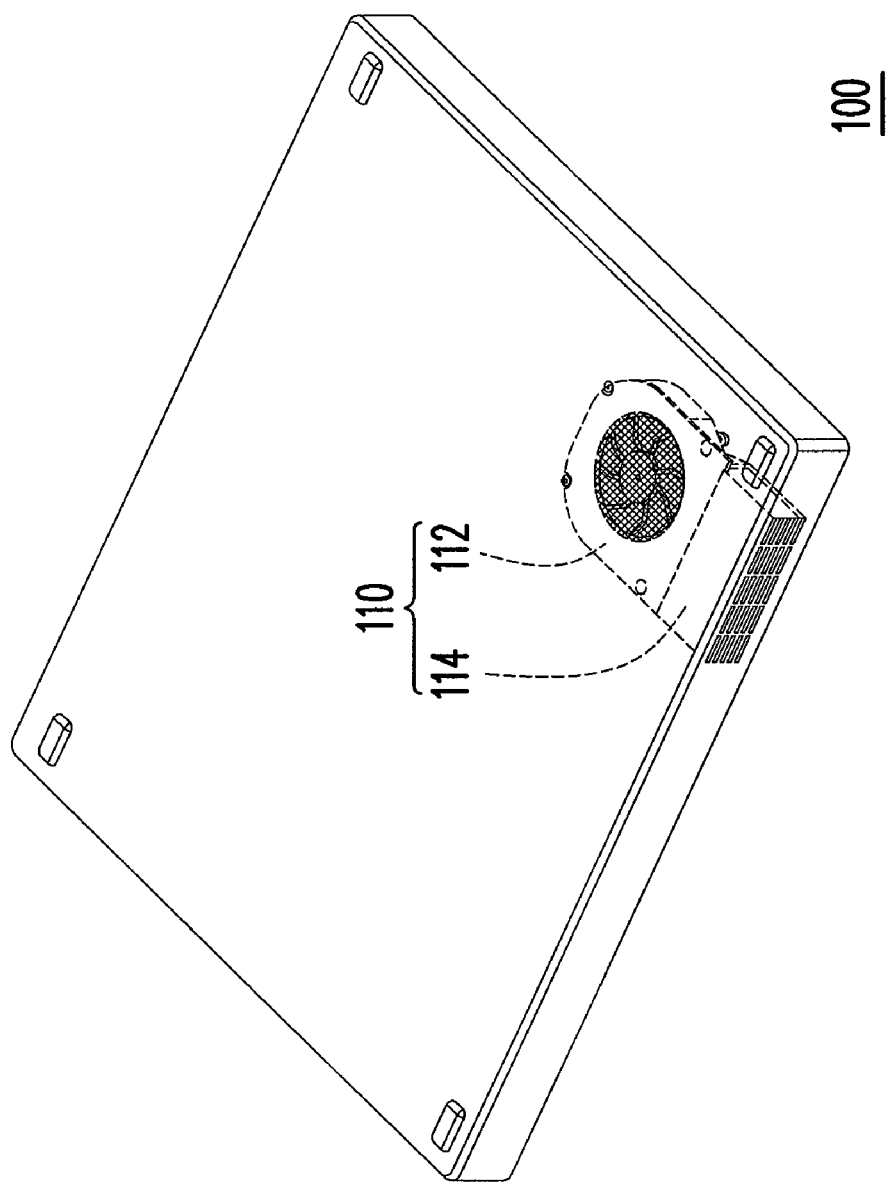
FIG. 1 is a schematic diagram illustrating a conventional electronic device.
Figure 2:
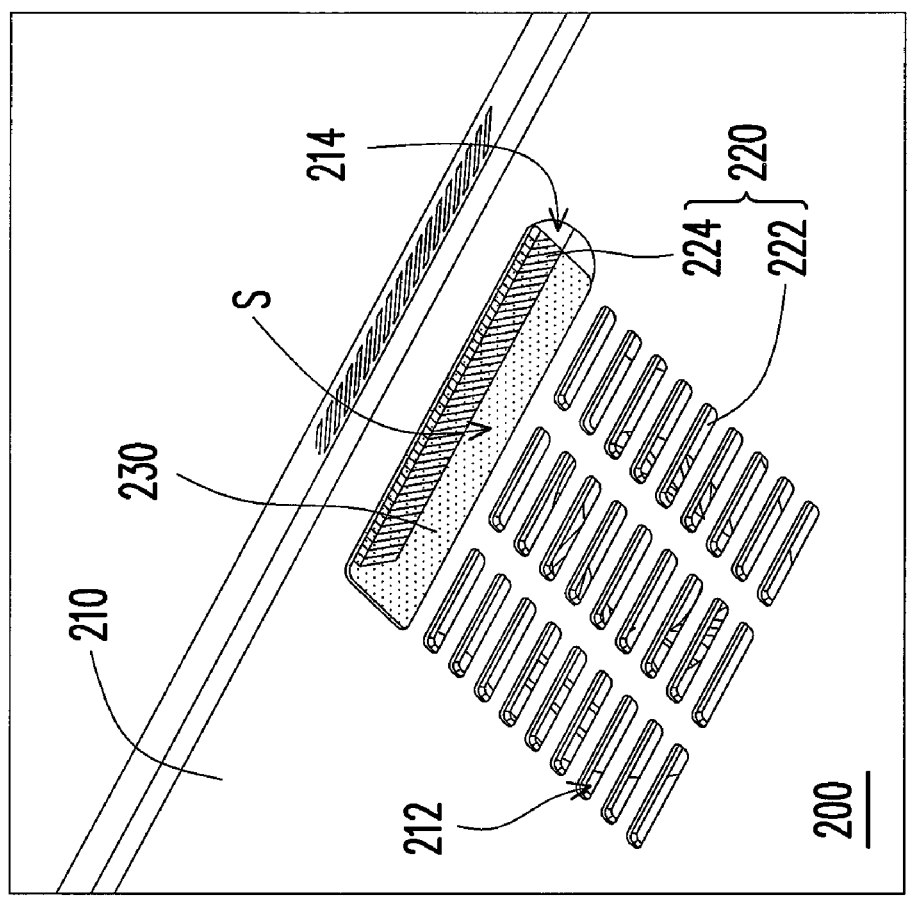
FIG. 2 is a schematic diagram illustrating an electronic device according to an embodiment of the present invention.
Figure 3:
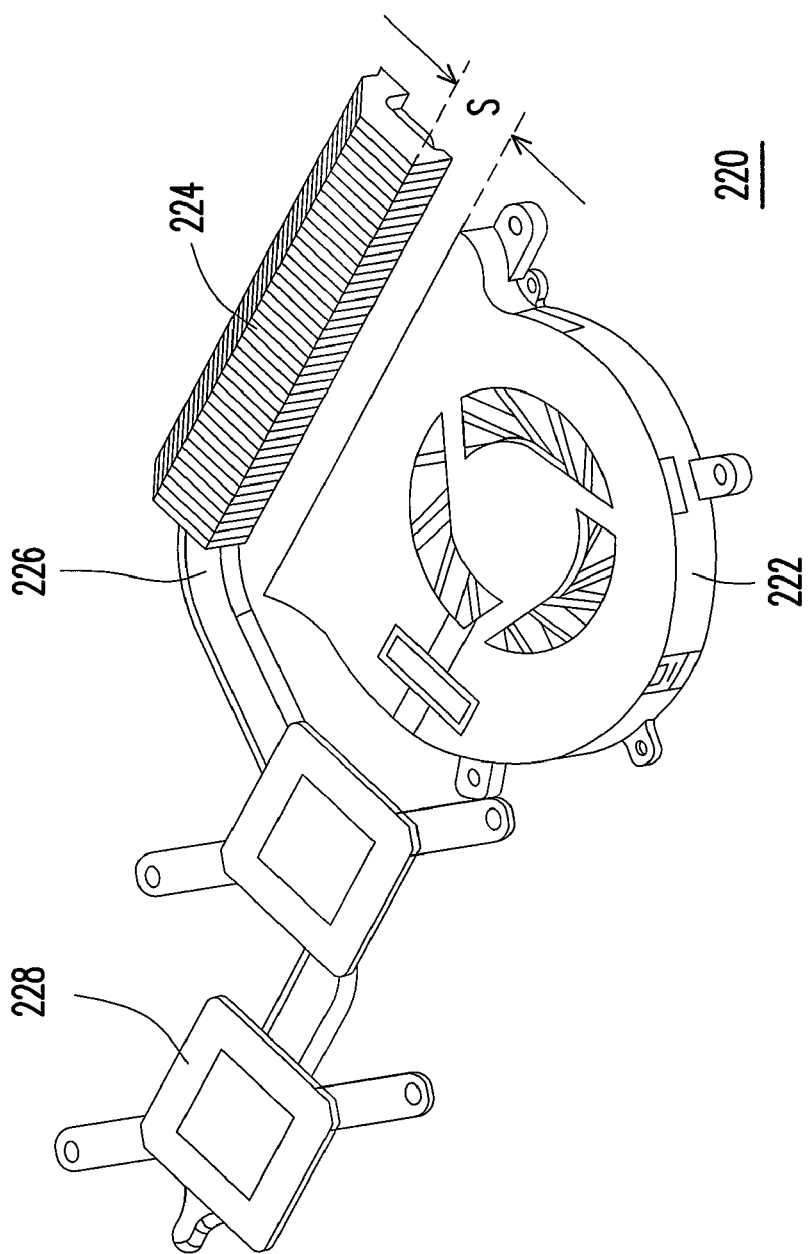
FIG. 3 is a schematic diagram illustrating a fan module of an electronic device of FIG. 2.

FIG. 2 is a schematic diagram illustrating an electronic device according to an embodiment of the present invention. FIG. 3 is a schematic diagram illustrating a fan module of the electronic device of FIG. 2. Referring to FIG. 2 and FIG. 3, the electronic device 200 of the present embodiment includes a case 210, a fan module 220, and a transparent movable cover 230. The fan module 220 is disposed in the case 210, and includes a fan 222 and a fin set 224. The fin set 224 is disposed aside the fan 222, and a space S is formed between the fin set 224 and the fan 222. The transparent movable cover 230 is connected to the case 210 and is located above the space S formed between the fin set 224 and the fan 222.

Figure 4:
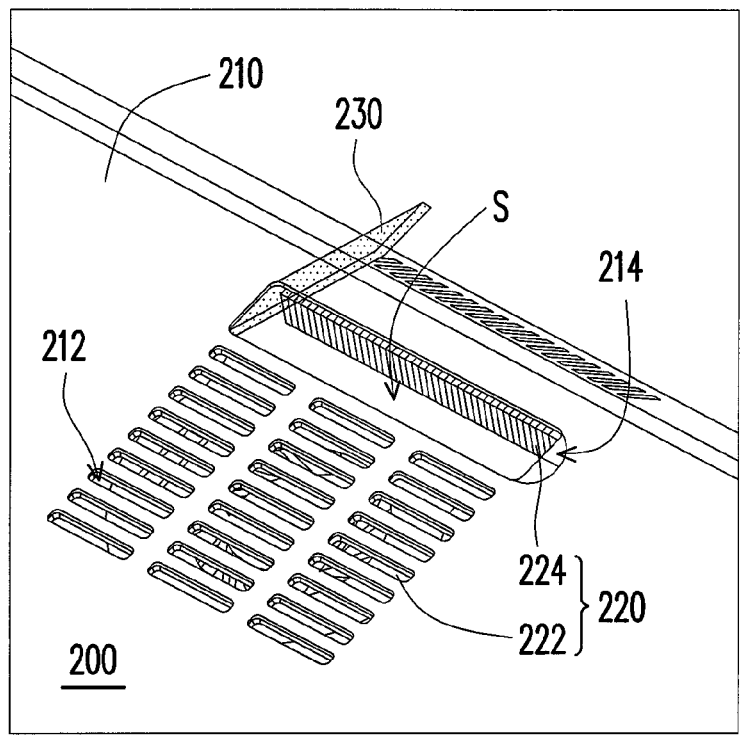
FIG. 4 is a schematic diagram illustrating a situation that a transparent movable cover of FIG. 2 is opened relative to a case.
Figure 5:
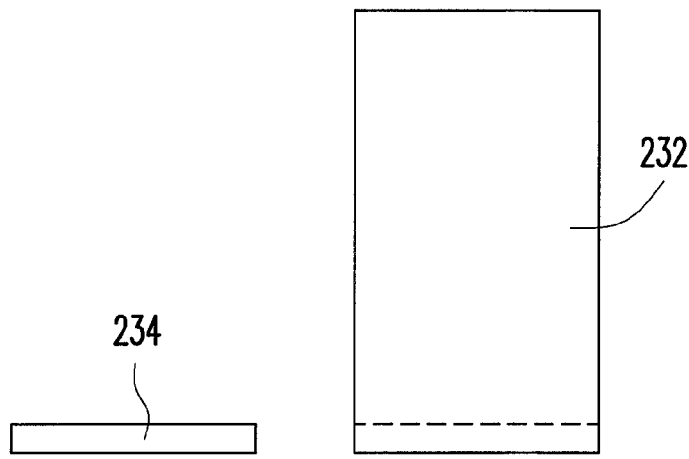
FIG. 5 is a schematic diagram illustrating an example of a transparent movable cover.
Figure 6:
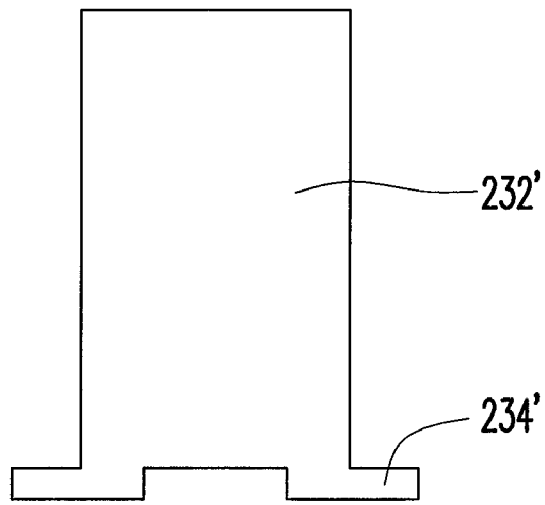
FIG. 6 is a schematic diagram illustrating another example of a transparent movable cover.

The case 210 has a plurality of openings 212, and the openings 212 are correspondingly located above the fan 222 of the fan module 220 to serve as an air outlet or an air inlet of the fan 222. Moreover, one side of the transparent movable cover 230 is connected to the case 210, so that another side of the transparent movable cover 230 can be opened and closed relative to the case 210. FIG. 4 is a schematic diagram illustrating a situation that the transparent movable cover of FIG. 2 is opened relative to the case, and FIG. 5 is a schematic diagram illustrating an example of a transparent movable cover. Referring to FIG. 2, FIG. 4 and FIG. 5, in detail, the transparent movable cover 230 includes a body 232 and a pivot 234. The pivot 234 is disposed at one side of the body 232, and two ends of the pivot 234 are pivoted to the case 210, so that another side of the body 232 can be opened (shown in FIG. 4) and closed (shown in FIG. 2) relative to the case 210. FIG. 6 is a schematic diagram illustrating another example of a transparent movable cover. Referring to FIG. 6, in this embodiment, a pivot 234' and a body 232' are formed integrally. Referring to FIG. 2 and FIG. 4 again, the case 210 has a concave part 214, and the concave part 214 is located adjacent to a side of the transparent movable cover 230 that is not connected to the case 210.

Referring to FIG. 3 again, the fan module 220 further includes a heat pipe 226 passing through the fin set 224, and a part of the heat pipe 226 surrounds the fan 222. Moreover, the fan module 220 further includes a plurality of cooling plates 228 contacted to the heat pipe 226, and the cooling plates 228 are disposed on electronic components (not shown), for example, a processor chip, in the case 210, so that the heat generated by the electronic components can be conducted to the cooling plates 228.

Referring to FIG. 2 and FIG. 4 again, when the electronic device 200 is operated, the processor chip in the case 210 generates heat. Then, the heat is first conducted to the cooling plate 228, and then the cooling plate 228 transmits the heat to the heat pipe 226 for cooling, and the fan 222 can forcibly expel the heat to external of the case 210.

Cotton and dust can enter the case 210 through the openings 212 of the case 210 due to the operation of the fan 222, and can be piled on the fin set 224. The longer time the electronic device 200 is used, the more the cotton and dust are piled on the fin set 224. At present, the user can observe a status of the cotton and the dust piled on the fin set 224 through the transparent movable cover 230, and then decides whether or not to clean the cotton and the dust piled on the fin set 224.

Referring to FIG. 2 and FIG. 4 again, when the user decides to clean the cotton and the dust piled on the fin set 224, the user opens the side of the transparent movable cover 230 that is not connected to the case 210 relative to the case 210, and easily puts a brush, a cotton swab or other cleaning supplies in the space S formed between the fan 222 and the fin set 224 to clean the cotton and the dust piled on the fin set 224. Moreover, a height step is formed between the concave part 214 of the case 210 and the side of the transparent movable cover 230 that is not connected to the case 210, so as to facilitate the user reaching his/her fingers to the height step to open the transparent movable cover 230 relative to the case 210.

Therefore, the cotton and the dust piled on the fin set 224 can be cleaned without disassembling the case 210, the other electronic components in the case 210, and even the fin set 224 from the case 210, which is an easy way to perform the cleaning, so that the electronic device 100 is convenient for using.

Figure 7:
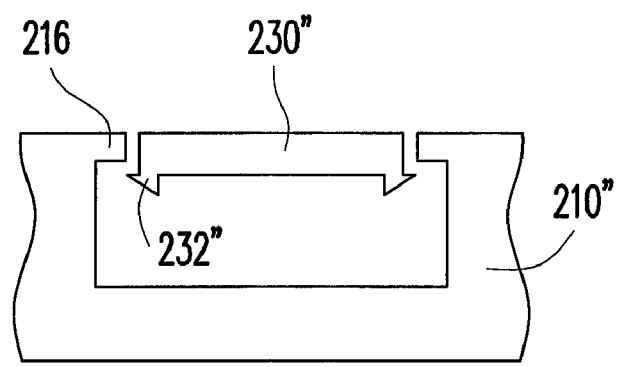
FIG. 7 is a schematic diagram illustrating a transparent movable cover and a case according to another embodiment of the present invention.

FIG. 7 is a schematic diagram illustrating a transparent movable cover and a case according to another embodiment of the present invention. Referring to FIG. 7, in this embodiment, the transparent movable cover 230" is not connected to the case 210" by one side that cannot be disassembled, but can be directly disassembled from the case 210". In detail, the transparent movable cover 230" has a hook 232", and the case 210" has a fastener 216. When the transparent movable cover 230" is assembled to the case 210", the hook 232" is engaged to the fastener 216, and when the user disassembles the transparent movable cover 230" from the case 210", the user disables a restriction between the hook 232" and the fastener 216, so as to disassemble the whole transparent movable cover 230" from the case 210".

In summary, since the electronic device of the present invention has the transparent movable cover, the user can observe a status of the cotton and the dust piled on the fin set through the transparent movable cover, so as to decide whether or not to perform the cleaning. Moreover, due to a configuration of the transparent movable cover and the space formed between the fan and the fin set, the user can easily clean the cotton and dust piled on the fin set by opening the transparent movable cover relative to the case or disassembling the transparent movable cover from the case without disassembling the case, the other electronic components in the case, and even the fin set from the case. Therefore, the electronic device is convenient for using.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. An electronic device, comprising:
a case, having a plurality of openings and a concave part;
a fan module, disposed in the case, and comprising:

a fan, and located under the openings;

a fin set, disposed aside the fan, wherein a space is formed between the fin set and the fan with no elements being disposed therein;

a heat pipe, passing through the fin set, and a part of the heat pipe surrounding the fan; and a transparent movable cover, located above the space formed between the fin set and the fan, wherein one side of the transparent movable cover is connected to the case, another side of the transparent movable cover is capable of being opened and closed relative to the case, and the concave part is located adjacent to the side of the transparent movable cover that is not connected to the case.

2. The electronic device as claimed in claim 1, wherein the transparent movable cover is capable of being disassembled from the case.

3. The electronic device as claimed in claim 1, wherein the transparent movable cover comprises:

a body; and a pivot, disposed at one side of the body, and two ends of the pivot are pivoted to the case, so that another side of the body is capable of being opened and closed relative to the case.

4. The electronic device as claimed in claim 3, wherein the pivot and the body are formed integrally.

5. The electronic device as claimed in claim 1, wherein the fan module further comprises a plurality of cooling plates, and the heat pipe is contacted to the cooling plates.

* * * * *